(12) United States Patent
Hino et al.

(10) Patent No.: US 11,111,573 B2
(45) Date of Patent: Sep. 7, 2021

(54) COMPONENT AND SEMICONDUCTOR MANUFACTURING DEVICE

(71) Applicant: KYOCERA CORPORATION, Kyoto (JP)

(72) Inventors: Takashi Hino, Kanagawa (JP); Tetsuo Inoue, Kanagawa (JP); Shuichi Saito, Kanagawa (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/777,371

(22) Filed: Jan. 30, 2020

(65) Prior Publication Data

US 2020/0165715 A1    May 28, 2020

Related U.S. Application Data

(63) Continuation of application No. PCT/JP2018/028376, filed on Jul. 30, 2018.

(30) Foreign Application Priority Data

Jul. 31, 2017  (JP) .............................. JP2017-147757

(51) Int. Cl.
  *C23C 14/08*  (2006.01)
  *H01L 21/3065*  (2006.01)
  (Continued)

(52) U.S. Cl.
  CPC ........ *C23C 14/083* (2013.01); *H01L 21/3065* (2013.01); *C30B 25/00* (2013.01);
  (Continued)

(58) Field of Classification Search
  USPC ........................................................ 428/632
  See application file for complete search history.

(56) References Cited

U.S. PATENT DOCUMENTS 5,905,334 A    5/1999  Nakamura et al.
2007/0248832 A1  10/2007  Maeda et al.
(Continued)

FOREIGN PATENT DOCUMENTS

CN  101117702 A  2/2008
CN  102296263 A  12/2011
(Continued)

OTHER PUBLICATIONS

C. Jagadeeswara Rao et al. "Performance evaluation of plasma sprayed yttria coatings on high density graphite for cathode processor applications", Ceramics International, 2015, 41(2), p. 3128-3136. (Year: 2014).*

(Continued)

*Primary Examiner* — Humera N. Sheikh
*Assistant Examiner* — John D Schneible
(74) *Attorney, Agent, or Firm* — Procopio, Cory, Hargreaves & Savitch LLP

(57) ABSTRACT

A component includes a film containing polycrystalline yttrium oxide. In an X-ray diffraction pattern of the film, a ratio $I_m/I_c$ of a maximum intensity $I_m$ of a peak attributed to monoclinic yttrium oxide to a maximum intensity $I_c$ of a peak attributed to cubic yttrium oxide satisfies an expression: $0 \leq I_m/I_c \leq 0.002$.

12 Claims, 2 Drawing Sheets

(51) Int. Cl.
  *C30B 25/10* (2006.01)
  *C30B 25/00* (2006.01)
  *C30B 28/12* (2006.01)
  *C30B 28/14* (2006.01)
  *C30B 29/16* (2006.01)
  *C30B 29/02* (2006.01)
  *C30B 28/00* (2006.01)
  *C30B 29/22* (2006.01)

(52) U.S. Cl.
  CPC .............. *C30B 25/10* (2013.01); *C30B 28/00* (2013.01); *C30B 28/12* (2013.01); *C30B 28/14* (2013.01); *C30B 29/02* (2013.01); *C30B 29/16* (2013.01); *C30B 29/22* (2013.01); *Y10T 428/12611* (2015.01); *Y10T 428/12618* (2015.01)

(56) References Cited

U.S. PATENT DOCUMENTS

| | | | |
|---|---|---|---|
| 2011/0174778 A1* | 7/2011 | Sawada et al. | ... H01J 37/32165 |
| 2012/0103519 A1* | 5/2012 | Aheem et al. | .......... C23F 11/00 |
| 2012/0216955 A1 | 8/2012 | Eto et al. | |
| 2013/0251949 A1 | 9/2013 | Sato et al. | |
| 2017/0029628 A1 | 2/2017 | Takai et al. | |
| 2017/0114440 A1 | 4/2017 | Takai et al. | |

FOREIGN PATENT DOCUMENTS

| | | | | |
|---|---|---|---|---|
| JP | H09102272 A | | 4/1997 | |
| JP | 2000256844 A | | 9/2000 | |
| JP | 2005335991 A | * | 12/2005 | ............ C04B 35/50 |
| JP | 2009287058 A | | 12/2009 | |
| JP | 4905697 B2 | | 3/2012 | |
| JP | 4994121 B2 | | 8/2012 | |
| JP | 5046480 B2 | | 10/2012 | |
| JP | 2012191200 A | | 10/2012 | |
| JP | 6084464 B2 | | 2/2017 | |
| JP | 2017031457 A | | 2/2017 | |
| JP | 2017082325 A | | 5/2017 | |

OTHER PUBLICATIONS

H. Kwon et al., "The importance of intimate inter-crystallite bonding for the plasma erosion resistance of vacuum kinetic sprayed $Y_2O_3$ coating" 2019, Surface and Coatings Technology, 374, p. 493-499. (Year: 2019).*

Y. Kim et al., "Correlation of Plasma Erosion Resistance and the Microstructure of $YF_3$ Coatings Prepared by Vacuum Kinetic Spray", 2020, Journal of Thermal Spray Technology, 29, p. 1016-1026. (Year: 2020).*

* cited by examiner

COMPONENT AND SEMICONDUCTOR MANUFACTURING DEVICE

CROSS-REFERENCE TO RELATED APPLICATIONS

This application is a continuation application of International Application No. PCT/JP2018/028376, filed on Jul. 30, 2018, which claims the benefit of priority from the prior Japanese Patent Application No. 2017-147757, filed on Jul. 31, 2017; the entire contents of which are incorporated herein by reference.

FIELD

Embodiments of the present invention relate to a component and a semiconductor manufacturing apparatus.

BACKGROUND

A semiconductor element is manufactured by combining a film-forming process and an etching process in a complicated manner.

In recent years, a semiconductor element sometimes requires fine wiring in accordance with high performance. A film-forming process is carried out by, for example, a chemical vapor deposition (CVD) method, a physical vapor deposition (PVD) method, or the like. Further, the film-forming process is carried out by using sputtering, an atomic layer deposition (ALD) method, or the like. These methods utilize a vacuum. For example, in the sputtering, ions are made to collide with a sputtering target, to thereby make atoms sputtered from a target surface to be deposited on a base material.

Dry etching is one kind of plasma etching. In the plasma etching, a fluorine-based gas or a chlorine-based gas is subjected to plasma discharge, to thereby generate fluorine-based plasma or chlorine-based plasma. This makes it possible to perform etching on a thin film on a base material. Further, there is also a method in which an etching gas is turned into plasma, and sputtering with the use of ions and a chemical reaction of the etching gas are simultaneously performed, as in reactive ion etching (RIE). By employing the RIE, it is possible to realize etching with high accuracy and suitable for microfabrication.

As described above, the plasma processing is used in both the film-forming process and the etching process. Accordingly, an inside of a semiconductor manufacturing apparatus is exposed to plasma. For this reason, a component mounted in the semiconductor manufacturing apparatus is required to have resistance with respect to the plasma (plasma resistance).

In order to improve yields of a semiconductor element, it is required to further suppress particles. In particular, because of realization of fine wiring, it is required to suppress generation of particles whose average diameter is 0.1 μm or less. It is difficult to suppress the above-described particles of a conventional yttrium oxide film.

A problem to be solved by an embodiment of the present invention is to increase plasma resistance of a component.

DETAILED DESCRIPTION

A component of an embodiment includes a film containing polycrystalline yttrium oxide. In an X-ray diffraction pattern of the film, a ratio $I_m/I_c$ of a maximum intensity $I_m$ of a peak attributed to monoclinic yttrium oxide to a maximum intensity $I_c$ of a peak attributed to cubic yttrium oxide satisfies an expression: $0 \leq I_m/I_c \leq 0.002$.

Hereinafter, embodiments will be described with reference to the drawings. Note that in the respective embodiments, substantially the same components are denoted by the same reference signs, and a part of description thereof may be omitted in some cases. The drawings are schematic, and the relation between thicknesses of respective parts and plane dimensions, ratios between the thicknesses of the respective parts and the like may differ from actual ones in some cases.

Figure 1:
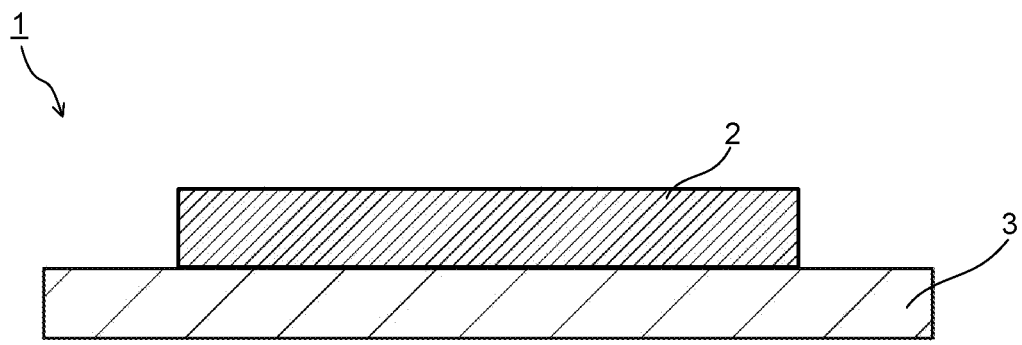
FIG. 1 is a view illustrating a configuration example of a component.

FIG. 1 is a view illustrating one example of a component. A component 1 includes a film 2. The film 2 is provided on a base material 3, for example. The film 2 contains polycrystalline yttrium oxide. The polycrystalline yttrium oxide is mainly formed of yttrium oxide crystals.

In an XRD diffraction pattern obtained by analyzing the film 2 by using an X-ray diffraction (XRD), a maximum intensity $I_m$ of a peak attributed to monoclinic yttrium oxide with respect to a maximum intensity $I_c$ of a peak attributed to cubic yttrium oxide satisfies an expression: $0 \leq I_m/I_c \leq 0.002$. The cubic yttrium oxide has a crystal structure of cubic system. The monoclinic yttrium oxide has a crystal structure of monoclinic system.

The peak attributed to the monoclinic yttrium oxide is detected at a diffraction angle (2θ) of 30 degrees or more and 33 degrees or less. Further, the peak attributed to the cubic yttrium oxide is detected at a diffraction angle (2θ) of 28 degrees or more and 30 degrees or less. When the XRD diffraction pattern has a plurality of peaks attributed to the monoclinic yttrium oxide, the maximum intensity of the peak having the maximum intensity out of the plurality of peaks, is defined as the maximum intensity $I_m$. Further, when the XRD diffraction pattern has a plurality of peaks attributed to the cubic yttrium oxide, the maximum intensity of the peak having the maximum intensity out of the plurality of peaks, is defined as the maximum intensity $I_c$. When the film 2 is thin and is influenced by the base material 3, it is also possible to measure the maximum intensities $I_m$, $I_c$ based on a thin film method.

The XRD analysis is performed by irradiating a surface of the film 2 with X-rays. The XRD analysis is performed by using a Cu target, at a tube voltage of 40 kV, at a tube current of 40 mA, with a slit diameter (RS) of 0.15 mm, and at a scanning speed of 0.5 sec/STEP.

The yttrium oxide has a crystal structure of cubic system, monoclinic system, or hexagonal system. A phase transition of the yttrium oxide from a cubic crystal to a monoclinic crystal occurs at a temperature in the vicinity of 1800° C. A phase transition of the yttrium oxide from a monoclinic crystal to a hexagonal crystal occurs at a temperature in the vicinity of 2200° C. The cubic crystal is stabilized at a temperature of 400° C. or more and 1000° C. or less.

A plasma processing process in a manufacturing process of a semiconductor element is generally performed at a temperature of 400° C. or more and 600° C. or less. The cubic yttrium oxide is stabilized in these temperature regions, so that it is possible to prevent generation of strains due to the phase transition. The monoclinic yttrium oxide has a larger number of lattice defects when compared to the cubic yttrium oxide. The monoclinic yttrium oxide is selectively corroded when it is exposed to a plasma atmosphere. This leads to generation of particles.

The component of the embodiment can greatly improve its plasma resistance by increasing a proportion of the cubic yttrium oxide in the film 2. It is preferable that the X-ray diffraction pattern does not have a peak attributed to yttrium oxide whose crystal structure is different from a crystal structure of the cubic yttrium oxide. When the expression: $0 \leq I_m/I_c \leq 0.002$ is satisfied, this indicates that the film 2 is substantially formed of the cubic yttrium oxide. Besides, when $I_m/I_c=0$ is satisfied, it is indicated that the X-ray diffraction pattern does not have a peak attributed to the monoclinic yttrium oxide. Specifically, it is indicated that the film 2 is formed of the cubic yttrium oxide. When $I_m/I_c$ exceeds 0.002, this indicates that a proportion of the monoclinic yttrium oxide is larger than a proportion of the cubic yttrium oxide.

In the component having the polycrystalline yttrium oxide film having a mixed structure of the cubic yttrium oxide and the monoclinic yttrium oxide, a weight decrease rate due to plasma etching is low, but, uniformity of the film is also low. $I_m/I_c$ in a conventional polycrystalline yttrium oxide film is 0.005 or more and 0.1 or less. On the contrary, $I_m/I_c$ in the film 2 is 0 or more and 0.002 or less. This indicates that the uniformity of the film 2 is higher than the uniformity of the conventional polycrystalline yttrium oxide film. By decreasing $I_m/I_c$, it is possible to reduce generation of particles with a diameter of 0.1 μm or more and 0.3 μm or less in the film 2.

A thickness of the film 2 is preferably 100 μm or less. When the thickness exceeds 100 μm, a further effect cannot be obtained, and on the contrary, this may lead to increase in cost. Note that although a lower limit of the thickness is not particularly limited, it is preferably 2 μm or more. If the thickness is less than 2 μm, there is a possibility that a mechanical strength of the film 2 is lowered. For this reason, the thickness of the film 2 is preferably 2 μm or more and 100 μm or less, and more preferably 10 μm or more and 50 μm or less.

An average grain diameter of the polycrystalline yttrium oxide is preferably 10 nm or less. By setting the average grain diameter to 10 nm or less, it is possible to reduce the size and the number of pores in the film 2. The pore is formed at a grain boundary between crystals. The average grain diameter is preferably 10 nm or less, more preferably 1 nm or less, and still more preferably 0.5 nm or less.

The average grain diameter can be measured by the following measuring method, for example. A scanning electron microscope (SEM) is used to take a macrophotograph of a surface of the film 2. The number of pieces of yttrium oxide crystals that exist on a straight line with a length of 5 μm in the macrophotograph, is defined as the average grain diameter.

Figure 2:
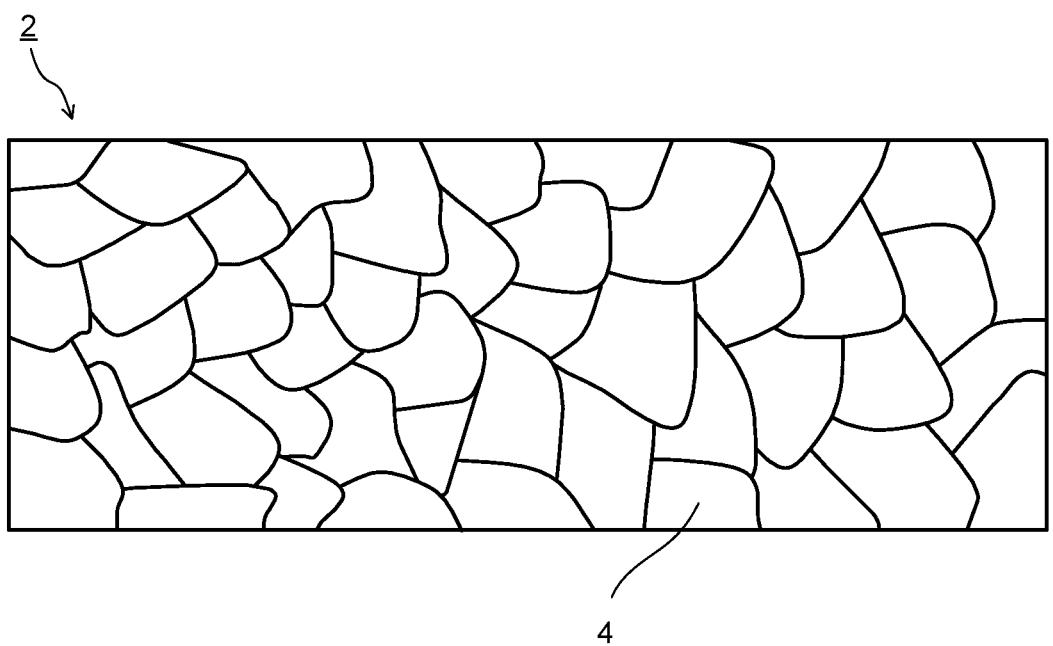
FIG. 2 is a view illustrating an example of a cross-sectional structure of a film.

FIG. 2 is a view illustrating one example of a cross-sectional structure of the film 2. The film 2 has yttrium oxide crystals 4. In an observation image obtained by observing an arbitrary cross section in a thickness direction of the film 2 by using the SEM at 10000 magnifications, a maximum diameter of a pore is preferably 0 nm or more and 10 nm or less. The pore is observed by performing ion milling processing on the arbitrary cross section.

A longest diagonal line of a pore photographed in the SEM photograph is set to the maximum diameter of the pore. When the maximum diameter of the pore is 0 nm, this indicates a state where the pore is not observed. When the maximum diameter of the pore is reduced to 10 nm or less, there is no pore to be a cause of defect, so that it is possible to improve the plasma resistance of the film 2. By reducing the average grain diameter of the polycrystalline yttrium oxide (plural yttrium oxide crystals 4), it is possible to set the maximum diameter of the pore in the film 2 to 10 nm or less. Note that when the maximum diameter of the pore is 0 nm, this indicates that the pore is not observed. When the SEM photograph is used, it is possible to distinguish the pore from the yttrium oxide crystal based on a difference in contrast.

A content of the yttrium oxide in the film 2 is preferably 99.0 mass % or more, and more preferably 99.3 mass % or more. A content of impurity metal components in the film 2 is preferably 1 mass % or less, and more preferably 0.7 mass % or less. In particular, it is preferable that a content of Al (aluminum) is 100 mass ppm or less, a content of Mg (magnesium) is 20 mass ppm or less, a content of Na (sodium) is 50 mass ppm or less, a content of Fe (iron) is 50 mass ppm or less, a content of Zn (zinc) is 100 mass ppm or less, a content of Ca (calcium) is 100 mass ppm or less, a content of K (potassium) is 5 mass ppm or less, a content of Ni (nickel) is 10 mass ppm or less, and a content of Cu (copper) is 10 mass ppm or less. Further, each of these contents is a value converted by a metal simple substance.

When Na, K, Ca, Mg are mixed in a semiconductor film, an adverse effect is exerted on a semiconductor performance. Accordingly, if Na or the like is mixed as an impurity when a semiconductor element is manufactured by using a semiconductor manufacturing apparatus including the aforementioned component, an adverse effect is exerted on a performance of the semiconductor element.

Al, Mg, Fe, Zn, Ni, Cu have a high reactivity with plasma. For this reason, when the contents thereof exceed the aforementioned contents, this becomes a cause of reducing the plasma resistance. When a variation in refractive index is 1% or less, this indicates that a dispersion state of the impurity metal components is homogeneous. This makes it possible to prevent a portion with low plasma resistance from being partially generated. In other words, even in a case of containing a small amount of impurity metal components, the plasma resistance can be improved by making the dispersion state to be homogeneous.

A heat shock resistance of the component 1 can also be improved by the film 2. The heat shock resistance can be judged by a heat shock test of measuring a decreasing rate of a tensile strength after exposure under a high-temperature environment with respect to a tensile strength at an ordinary temperature (25° C.).

A decreasing rate X of a tensile strength B (MPa) after exposure under a high-temperature environment with respect to a tensile strength A (MPa) at an ordinary temperature is expressed by an expression: $X (\%)=((A-B)/A)\times 100$.

In the processing of making the component 1 to be exposed under the high-temperature environment, "30 minutes at 400° C.→30 minutes at ordinary temperature" is set to processing of one time (one cycle), and a tensile strength after repeating the aforementioned processing three times (after three cycles) is set to the tensile strength B. Since the component 1 is excellent in the heat shock resistance, the decreasing rate of the tensile strength can be set to 20% or less, further, it can be set to 15% or less, and furthermore, it can be set to 10% or less. The tensile strength is measured by, for example, a Sebastian tensile testing method. Specifically, a test terminal is bonded to a surface of the film 2 by using an epoxy adhesive, and then the test terminal is pulled in a direction perpendicular to the surface of the film 2, thereby determining a peel strength between the film 2 and a base material 3.

As a Sebastian tensile tester, it is possible to use Sebastian V-A model manufactured by Quad Group Inc., for example. Test conditions are set such that FORCE LIMIT is set to "Max", an Auto-side switch RATE is set to "one scale from L0 (load adaptive rate of 0.5 kg/sec to 10 kg/sec)", and SCALING is set to "FORCE". Note that a tensile speed is changed depending on a tensile strength, so that the load adaptive rate is 0.5 kg/sec to 10 kg/sec. The load adaptive rate becomes slow when the tensile strength is high, and the load adaptive rate becomes fast when the tensile strength is low.

Although 400° C. is exemplified as the high-temperature side, it is also possible to employ 600° C. The temperature range from 400° C. to 600° C. is a temperature adjusted by assuming a maximum attained temperature in a dry etching apparatus. Even after the component 1 is exposed under a high-temperature environment of 600° C., the decreasing rate of the tensile strength can be set to 20% or less, further, it can be set to 15% or less, and furthermore, it can be set to 10% or less.

Next, a manufacturing method of the component 1 will be described. Although the manufacturing method of the component 1 is not particularly limited, the following method can be cited as a method of obtaining the component 1 with good yields.

The base material 3 is prepared. As the base material 3, there can be cited ceramics, a metal, or the like, for example, but, it is not limited in particular. As the ceramics, there can be cited aluminum oxide, aluminum nitride, or the like, for example. As the metal, there can be cited copper, aluminum, stainless steel, or the like, for example. A surface of the base material 3 preferably has a flat surface with a surface roughness Ra of 2 μm or less.

Next, a process of forming a yttrium oxide film on the base material 3 is performed. A film-forming method is preferably sputtering. First, a sputtering target made of metal yttrium is prepared. When the metal yttrium target is used, it is possible to improve purity and density by repeating a melting method. For example, in a target obtained by solidifying $Y_2O_3$ powders, it is difficult to realize densification. Further, since there is a need to use a sintering aid for the densification, mixing of impurities is unavoidable.

The purity of the metal yttrium target is preferably 99.0 mass % or more, and more preferably 99.3 mass % or more. It is preferable that in the target, a content of Al (aluminum) is 300 mass ppm or less, a content of Mg (magnesium) is 20 mass ppm or less, a content of Na (sodium) is 100 mass ppm or less, a content of Fe (iron) is 50 mass ppm or less, a content of Zn (zinc) is 100 mass ppm or less, a content of Ca (calcium) is 100 mass ppm or less, a content of K (potassium) is 10 mass ppm or less, a content of Ni (nickel) is 20 mass ppm or less, and a content of Cu (copper) is 20 mass ppm or less.

The content of metal yttrium excluding impurity rare-earth elements is preferably 99.9 mass % or more. The impurity rare-earth elements are rare-earth elements except for yttrium. By previously controlling the amounts of the impurity metal components in the metal yttrium target, it is possible to control the amounts of the impurity metal components in the yttrium oxide film.

By performing sputtering on the metal yttrium target, a metal yttrium film is formed. Next, an oxidation process is performed. The formation of the metal yttrium film and the oxidation process are alternately performed, to thereby form the film 2. In the oxidation process, the metal yttrium film is heated in an oxygen-containing atmosphere. By performing the heating in the oxygen environment at a temperature of 1000° C. or less, the expression: $0 \leq I_m/I_c \leq 0.002$ can be satisfied.

When the oxidation is performed by setting a thickness of a sputtering film that uses the metal yttrium target to 10 nm or less, it is possible to set the average grain diameter of the polycrystalline yttrium oxide crystals to 10 nm or less. When the oxidation is performed by reducing the thickness of the sputtering film, it is possible to reduce the size of the yttrium oxide crystal. When the metal yttrium film formation, the oxidation process, the metal yttrium film formation, and the oxidation process are repeated, it is possible to form the polycrystalline yttrium oxide in which the size and the number of pores are small. Further, by employing the process of oxidizing the thin metal yttrium film with the thickness of 10 nm or less, it is possible to form a homogeneous film.

A film-forming atmosphere is preferably set to a vacuum atmosphere. A degree of vacuum is preferably 0.5 Pa or less. The oxidation process is preferably performed by using plasma processing. The oxidation process is a process in which heat treatment is performed in an oxygen-containing atmosphere, to thereby turn metal yttrium into yttrium oxide. As described above, the metal yttrium film is a thin film of 10 nm or less. By using the plasma processing, it is possible to perform the oxidation process in a short period of time.

The plasma processing is preferably performed for one second or less per one process (1 sec/pass or less), and more preferably performed at 0.5 sec/pass or less. It takes about 30 sec/pass in normal heat treatment in an oxygen-containing atmosphere. By performing the oxidation process in a short period of time, the growth of crystal grain diameter can be suppressed. Further, by performing the heat treatment in a vacuum, the way of transferring heat to the metal yttrium film can be uniformized. When the way of transferring heat is uniformized, the degree of grain growth becomes uniform. Consequently, it is possible to suppress the formation of pores.

It is also effective to employ reactive sputtering in which a metal yttrium target is used and sputtering is performed in an oxygen-containing atmosphere. The reactive sputtering is a method of forming a yttrium oxide film while making the target react with oxygen in the sputtering atmosphere. Since the method has no oxidation heat treatment process when compared to the above-described method of oxidizing the metal yttrium film, a load on a manufacturing facility is reduced. Meanwhile, since the target is made to react with oxygen in the sputtering atmosphere, a film-forming time is long. In the above-described manufacturing method, the film formation by using the $Y_2O_3$ powders with the use of combustion flame is not performed, so that the monoclinic yttrium oxide is difficult to be formed.

When the yttrium oxide film is formed by using the combustion flame, the $Y_2O_3$ powders are instantly exposed to a high temperature, so that the monoclinic yttrium oxide is likely to be formed. On the contrary, the film 2 is formed by oxidizing the metal yttrium film, for example, so that it is possible to form a film having the polycrystalline yttrium oxide substantially formed only of the cubic yttrium oxide.

Next, an example of a semiconductor manufacturing apparatus including the component of the embodiment will be described. An example of a semiconductor manufacturing apparatus of an embodiment includes a chamber, a support provided in the chamber and on which a base material is mounted, and a mechanism for generating plasma in the chamber to perform plasma processing. The above-described mechanism has the component of the embodiment.

As the plasma processing, there can be cited RIE, plasma CVD, ALD, PVD, sputtering, plasma etching, or the like.

A manufacturing process of a semiconductor element often employs a process using CVD, PVD, or the like, and performed by using plasma. A wiring film is etched to form fine wiring. For example, an etching process uses a dry etching method. The dry etching is one kind of plasma etching. In a plasma etching method, a fluorine-based gas or a chlorine-based gas is subjected to plasma discharge, to thereby generate fluorine-based plasma or chlorine-based plasma. Consequently, it is possible to perform etching on a thin film on a base material.

In the RIE, an etching gas is turned into plasma, and sputtering with the use of ions and a chemical reaction of the etching gas are simultaneously performed. By employing the RIE, it is possible to realize etching with high accuracy and suitable for microfabrication.

The inside of the semiconductor manufacturing apparatus is exposed to plasma. By improving the plasma resistance of a component used in the semiconductor manufacturing apparatus, it is possible to improve the durability of the apparatus itself. Further, since the generation of particles can also be prevented, the yields of the semiconductor element can also be improved.

As the component, there can be cited, for example, an electrostatic chuck, a chamber, a microwave introducing window, a shower head, a focus ring, a shield ring, or the like. Further, the use of the component is effective in a manufacturing apparatus of a semiconductor element required to have finer wiring, such as CMOS (Complementary Metal Oxide Semiconductor).

Figure 3:
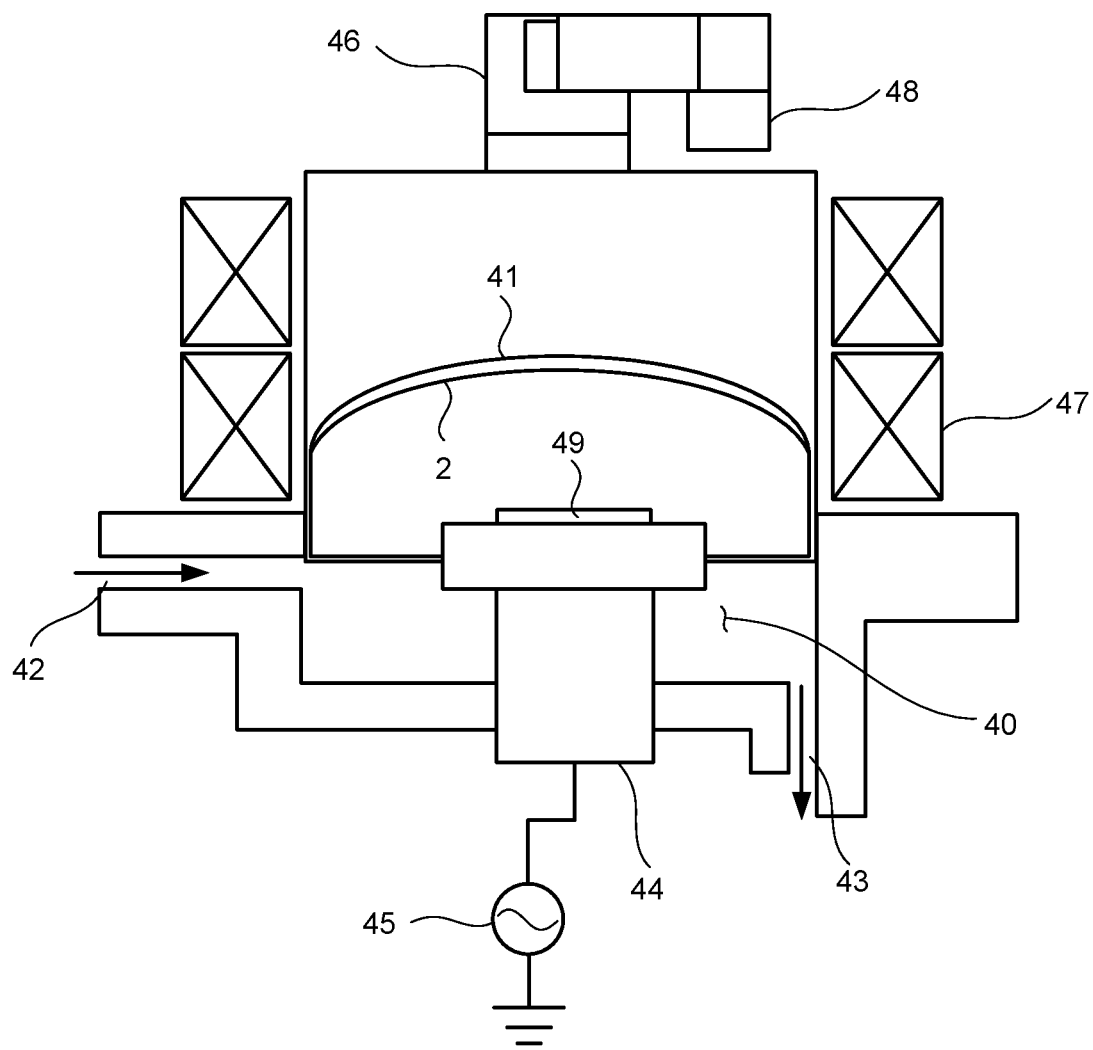
FIG. 3 is a view illustrating a configuration example of a semiconductor manufacturing apparatus.

FIG. 3 is a schematic view illustrating a configuration example of a dry etching apparatus as a semiconductor manufacturing apparatus. A semiconductor manufacturing apparatus illustrated in FIG. 3 includes a processing chamber 40, a discharge tube 41, a sample stage 44, a waveguide 46, a solenoid coil 47 generating a magnetic field in the discharge tube 41, and a magnetron 48 provided to an end portion of the waveguide 46 and generating a microwave.

The processing chamber 40 has a space for performing the plasma processing, a gas supply port 42 for introducing an etching gas, and a vacuum exhaust port 43. The vacuum exhaust port 43 is connected to a vacuum pump, for example. The vacuum pump exhausts air in the processing chamber 40 to form a vacuum atmosphere.

The discharge tube 41 is provided at an upper part of the processing chamber 40. The discharge tube 41 is formed of quartz or the like, for example. The component of the embodiment is used for the discharge tube 41, for example. When the discharge tube 41 is the base material 3, the film 2 is provided to an inner surface of the discharge tube 41. On the outside of the discharge tube 41, the waveguide 46 is provided.

The sample stage 44 is provided inside the processing chamber 40. The sample stage 44 is connected to a high-frequency power source 45, and can receive a high-frequency power.

In the semiconductor manufacturing apparatus illustrated in FIG. 3, an etching gas is introduced from the gas supply port 42 into the inside of the processing chamber 40, and the air in the processing chamber 40 is exhausted under reduced pressure. The microwave from the magnetron 48 is introduced into the inside of the discharge tube 41 by the waveguide 46, and the magnetic field is formed by the solenoid coil 47. By an interaction of an electric field of the microwave and the magnetic field formed by the solenoid coil 47, the etching gas in the discharge tube 41 is turned into plasma. Besides, the high-frequency power is applied to the sample stage 44 by the high-frequency power source 45 to generate a bias voltage, and ions in the plasma are drawn toward a wafer 49 side to perform anisotropic etching.

The component of the embodiment has high plasma resistance. Accordingly, when the component is used in the semiconductor manufacturing apparatus, it is possible to reduce the generation of particles. Further, since it is possible to suppress exposure of a surface of the discharge tube 41, it is possible to reduce the generation of particles due to peeling of a part of the surface.

EXAMPLES

Examples 1 to 5, Comparative Example 1

As a base material, an alumina substrate was prepared. Polishing was performed so that a surface roughness Ra of a surface of the substrate became 1.0 μm. Next, a metal yttrium target with purity of 99.5 mass % was prepared. On the alumina substrate, a process of forming a metal yttrium film and an oxidation process were repeatedly performed to form a film containing polycrystalline yttrium oxide. Further, in each of Examples 1 to 3, a thickness of the metal yttrium film was set to fall within a range of 3 to 7 nm. By repeatedly performing the metal yttrium film formation process and the oxidation process, components 1 each having a thickness shown in Table 1 were produced.

In Example 5, the component was produced by repeatedly performing the formation of the metal yttrium film with a thickness of 80 to 100 nm and the oxidation process. A thickness of a yttrium oxide film in each of Examples and Comparative Example was unified to 20 μm. In Examples 1, 2, plasma processing was used to perform an oxidation process at 0.5 sec/pass or less. In Example 3 and Example 5, heat treatment was performed at an average rate of 30 sec/pass in an oxygen-containing atmosphere. In Example 4, film formation was performed based on a reactive sputtering method in an oxygen-containing atmosphere. In Comparative Example 1, a $Y_2O_3$ film was formed based a conventional method of using combustion flame.

In the metal yttrium target, a content of Al (aluminum) is 100 mass ppm or less, a content of Mg (magnesium) is 5 mass ppm or less, a content of Na (sodium) is 10 mass ppm or less, a content of Fe (iron) is 20 mass ppm or less, a content of Zn (zinc) is 10 mass ppm or less, a content of Ca (calcium) is 10 mass ppm or less, a content of K (potassium) is 5 mass ppm or less, a content of Ni (nickel) is 10 mass ppm or less, and a content of Cu (copper) is 10 mass ppm or less. When impurity rare-earth elements are included in impurity metals, the purity of the metal yttrium target was 99.2 mass %.

The components according to Examples and Comparative Example were subjected to XRD analysis. The XRD analysis was performed by using a Cu target, at a tube voltage of 40 kV, at a tube current of 40 mA, with a slit diameter (RS) of 0.15 mm, and at a scanning speed of 0.5 sec/STEP. $I_m/I_c$ was determined by setting a peak appeared at a diffraction angle (2θ) of 30 degrees or more and 33 degrees or less to a peak attributed to a monoclinic crystal, and setting a peak appeared at a diffraction angle (2θ) of 28 degrees or more and 30 degrees or less to a peak attributed to a cubic crystal.

An average grain diameter of polycrystalline yttrium oxide was determined. The average grain diameter was determined based on a linear density method of observing a film surface with a SEM and determining the number of yttrium oxide crystals on a straight line of 5 μm.

A maximum diameter of a pore in the film was determined. In an observation image obtained by observing a cross section of the film by using the SEM at 10000 magnifications, a longest diagonal line of a pore was set to the maximum diameter of the pore. A major axis of the largest pore within a range of unit area of 5 μm×5 μm in an arbitrary cross section was indicated as the maximum diameter. Results thereof are shown in Table 1.

TABLE 1

| | Film | | | |
|---|---|---|---|---|
| | Thickness (μm) | $I_m/I_c$ | Average grain diameter (nm) | Maximum diameter of pore (nm) |
| Example 1 | 20 | 0 | 0.2 | 0 |
| Example 2 | 20 | 0 | 0.5 | 2 |
| Example 3 | 20 | 0.001 | 1.5 | 3 |
| Example 4 | 20 | 0.001 | 3.8 | 5 |
| Example 5 | 20 | 0.002 | 89 | 15 |
| Comparative Example 1 | 20 | 0.1 | 1.6 | 4 |

As can be understood from Table, $I_m/I_c$ of the film according to each of Examples 1 to 5 was 0.002 or less.

Further, in each of Example 1 and Example 2 in which $I_m/I_c$ was 0, a peak attributed to the monoclinic yttrium oxide was not detected, and only peaks attributed to the cubic yttrium oxide were detected. Further, in Example 1, no pore was observed in the unit area of 5 μm×5 μm. Note that the fact that the X-ray diffraction pattern indicates only the peaks attributed to the cubic crystals, can be confirmed by comparison with 00-041-1105 or 00-043-1036 of PDF database.

In Example 5, the average grain diameter was large to be 89 nm. In accordance with the increase in size of the grain diameter, the maximum diameter of the pore was also large. In Comparative Example 1, $I_m/I_c$ was large to be 0.1.

Next, the heat shock resistance of the components according to Examples and Comparative Example was measured. The heat shock resistance was determined based on a decreasing rate of a tensile strength B with respect to a tensile strength A. The measurement under high-temperature environments was conducted at 400° C. and at 600° C. Concretely, "30 minutes at 400° C.→30 minutes at ordinary temperature" was set to one cycle, and the tensile strength B after three cycles was measured. Further, "30 minutes at 600° C.→30 minutes at ordinary temperature" was set to one cycle, and the tensile strength B after three cycles was measured. The tensile strength was measured by the Sebastian tensile testing method. Concretely, a test terminal was bonded to a surface of the film by using an epoxy adhesive, and then the test terminal was pulled in a direction perpendicular to the surface of the film, thereby determining a peel strength between the base material and the film. The measurement was performed five times for each of the tensile strength A and the tensile strength B, and results thereof were indicated by minimum values and maximum values. Further, average values of five times of the measurements were also indicated. Further, as the decreasing rate, the lowest rate was described.

As a Sebastian tensile tester, Sebastian V-A model manufactured by Quad Group Inc. was used. Test conditions were set such that FORCE LIMIT was set to "Max", an Auto-side switch RATE was set to "one scale from L0 (load adaptive rate of 0.5 kg/sec to 10 kg/sec)", and SCALING was set to "FORCE". Results thereof are shown in Table 2.

TABLE 2

| | Tensile strength A (MPa) | | | Tensile strength B (MPa) | | | | | | | |
|---|---|---|---|---|---|---|---|---|---|---|---|
| | Ordinary temperature | | | 400° C. | | | | 600° C. | | | |
| | Min. value | Max. value | Ave. value | Min. value | Max. value | Ave. value | Decreasing rate (%) | Min. value | Max. value | Ave. value | Decreasing rate (%) |
| Ex. 1 | 62 | 80 | 74 | 60 | 78 | 72 | 5% or less | 59 | 75 | 71 | 6% or less |
| Ex. 2 | 60 | 75 | 70 | 57 | 72 | 68 | 5% or less | 55 | 69 | 67 | 6% or less |
| Ex. 3 | 55 | 70 | 65 | 50 | 66 | 62 | 7% or less | 46 | 62 | 59 | 8% or less |
| Ex. 4 | 65 | 75 | 68 | 58 | 68 | 62 | 7% or less | 52 | 64 | 60 | 9% or less |
| Ex. 5 | 52 | 57 | 53 | 40 | 47 | 44 | 15% or less | 37 | 44 | 42 | 17% or less |
| Comparative Ex. 1 | 25 | 40 | 32 | 10 | 30 | 21 | 30% or more | 5 | 20 | 18 | 30% or more |

In each of Examples 1 to 4, the decreasing rate of the tensile strength was 10% or less. Further, in Example 5, the decreasing rate was 17% or less at 600° C. This is because the average grain diameter of the polycrystalline yttrium oxide was large to be 89 nm. On the contrary, in Comparative Example 1, the decreasing rate was deteriorated to be 30% or more.

The minimum value of the tensile strength A was 52 MPa or more, the maximum value of the tensile strength A was 57 MPa or more, the average value of the tensile strength A was 53 MPa or more, the minimum value of the tensile strength B was 37 MPa or more, the maximum value of the tensile strength B was 44 MPa or more, and the average value of the tensile strength B was 42 MPa or more.

Next, the plasma resistance of the components according to Examples and Comparative Example was examined. As the plasma resistance, both a fluorine-based gas and a chlorine-based gas used in a plasma etching process were used to examine a weight decrease amount and the presence/absence of generation of particles. Further, the examination was performed also on the components whose thicknesses were respectively changed.

As the weight decrease amount, a weight reduced after 24 hours of the performance of the plasma etching process was indicated as the weight decrease amount. Further, the number of pieces of generated particles on a Si substrate was indicated while classifying sizes of the particles into a size of less than 0.1 µm and a size of 0.1 µm or more. Note that the number of pieces of generated particles was set to the number of pieces per unit area of 1 cm² on the Si substrate. Results thereof are shown in Table 3.

TABLE 3

| | Thickness (µm) | Weight decrease amount (mg/cm²) | | Particle (Pieces/cm²) | |
|---|---|---|---|---|---|
| | | Fluorine-based gas | Chlorine-based gas | Less than 0.1 µm | 0.1 µm or more |
| Ex. 1 | 20 | 0.003 | 0.003 | 8 | 3 |
| | 10 | 0.003 | 0.003 | 8 | 3 |
| Ex. 2 | 20 | 0.008 | 0.008 | 9 | 4 |
| | 30 | 0.008 | 0.008 | 9 | 4 |
| Ex. 3 | 20 | 0.014 | 0.016 | 11 | 6 |
| | 50 | 0.014 | 0.016 | 11 | 6 |
| Ex. 4 | 20 | 0.035 | 0.032 | 16 | 10 |
| | 80 | 0.037 | 0.035 | 16 | 10 |
| Ex. 5 | 20 | 0.098 | 0.092 | 28 | 17 |
| | 120 | 0.112 | 0.103 | 30 | 21 |
| Comparative Ex. 1 | 20 | 0.143 | 0.156 | 78 | 46 |

As can be understood from Table, in each of Examples in which the proportion of cubic yttrium oxide was increased, the weight decrease amount was reduced. It can be understood that the plasma resistance is excellent. Further, in accordance with that, the generation amount of particles was also reduced. In particular, it is possible to reduce small particles with an average diameter of less than 0.1 µm. It is possible to sufficiently deal with the realization of fine wiring.

When the average grain diameter and the maximum diameter of pore were increased as in Example 5, the plasma resistance was lowered. In particular, when the thickness exceeded 100 µm, the plasma resistance was lowered. For this reason, it was confirmed that the thickness is preferably 100 µm or less, and more preferably 10 µm or more and 50 µm or less. When $I_m/I_c$ was out of the range as in Comparative Example, the plasma resistance was lowered.

While certain embodiments of the present invention have been exemplified, these embodiments have been presented by way of example only, and are not intended to limit the scope of the inventions. Indeed, the novel embodiments described herein may be embodied in a variety of other forms; furthermore, various omissions, substitutions, changes, and the like in the form of the embodiments described herein may be made without departing from the spirit of the inventions. The accompanying claims and their equivalents are intended to cover such forms or modification examples as would fall within the scope and spirit of the inventions. Further, the aforementioned respective embodiments can be mutually combined to be carried out.

What is claimed is:

1. A component, comprising
a film containing crystalline yttrium oxide,
wherein
in an X-ray diffraction pattern of the film, a ratio $I_m/I_c$ of a maximum intensity $I_m$ of a peak attributed to monoclinic yttrium oxide to a maximum intensity $I_c$ of a peak attributed to cubic yttrium oxide satisfies an expression: $0 \leq I_m/I_c \leq 0.002$,
an average grain diameter of the crystalline yttrium oxide is 3.8 nm or less, and
in an observation image obtained by observing a cross section in a thickness direction of the film by using a scanning electron microscope at 10000 magnification, a pore is not present or a maximum diameter of a pore is 10 nm or less.

2. The component according to claim 1, wherein the X-ray diffraction pattern does not have a peak attributed to yttrium oxide whose crystal structure is different from a crystal structure of the cubic yttrium oxide.

3. The component according to claim 1, wherein a thickness of the film is 100 µm or less.

4. The component according to claim 1, wherein a thickness of the film is 10 µm or more and 50 µm or less.

5. The component according to claim 1, wherein: a content of yttrium oxide in the film is 99 mass % or more; a content of aluminum in the film is 100 mass ppm or less; a content of magnesium in the film is 20 mass ppm or less; a content of sodium in the film is 50 mass ppm or less; a content of zinc in the film is 100 mass ppm or less; a content of calcium in the film is 100 mass ppm or less; a content of potassium in the film is 5 mass ppm or less; and a content of nickel in the film is 10 mass ppm or less.

6. The component according to claim 1, wherein a tensile strength B of the film obtained after performing three cycles of exposing the component to a temperature environment between 400° C. and 600° C. for 30 minutes and then exposing the component to a temperature environment of 25° C. for 30 minutes, with respect to a tensile strength A of the film under a temperature environment of 25° C., satisfies an expression: $((A-B)/A) \times 100\% \leq 20\%$.

7. A semiconductor manufacturing apparatus, comprising the component according to claim 1.

8. The semiconductor manufacturing apparatus according to claim 7, further comprising a mechanism for performing plasma processing, wherein the mechanism has the component.

9. The component according to claim 1, wherein
the X-ray diffraction pattern does not have a peak attributed to yttrium oxide whose crystal structure is different from a crystal structure of the cubic yttrium oxide, and
a thickness of the film is 100 µm or less.

10. The component according to claim 1, wherein
the X-ray diffraction pattern does not have a peak attributed to yttrium oxide whose crystal structure is different from a crystal structure of the cubic yttrium oxide,
a thickness of the film is 100 µm or less,
a content of yttrium oxide in the film is 99 mass % or more,
a content of aluminum in the film is 100 mass ppm or less,
a content of magnesium in the film is 20 mass ppm or less,
a content of sodium in the film is 50 mass ppm or less,
a content of zinc in the film is 100 mass ppm or less, a content of calcium in the film is 100 mass ppm or less,
a content of potassium in the film is 5 mass ppm or less, and
a content of nickel in the film is 10 mass ppm or less.

11. A semiconductor manufacturing apparatus, comprising the component according to claim 9.

12. A semiconductor manufacturing apparatus, comprising the component according to claim 10.

\* \* \* \* \*